(12) United States Patent
Yang et al.

(10) Patent No.: US 9,159,394 B2
(45) Date of Patent: Oct. 13, 2015

(54) RING-SHAPED MAGNETORESISTIVE MEMORY DEVICE AND WRITING METHOD THEREOF

(71) Applicant: NATIONAL YUNLIN UNIVERSITY OF SCIENCE AND TECHNOLOGY, Yunlin County (TW)

(72) Inventors: Jyh-Shinn Yang, Taipei (TW); Ching-Ming Lee, Yunlin County (TW); Te-Ho Wu, Yunlin County (TW)

(73) Assignee: NATIONAL YUNLIN UNIVERSITY OF SCIENCE AND TECHNOLOGY, Yunlin County (TW)

( * ) Notice: Subject to any disclaimer, the term of this patent is extended or adjusted under 35 U.S.C. 154(b) by 0 days.

(21) Appl. No.: 14/267,904

(22) Filed: May 1, 2014

(65) Prior Publication Data
US 2015/0023092 A1 Jan. 22, 2015

(30) Foreign Application Priority Data
Jul. 17, 2013 (TW) .............................. 102125598 A

(51) Int. Cl.
*G11C 11/15* (2006.01)
*G11C 11/16* (2006.01)
*H01L 43/08* (2006.01)
*H01L 27/22* (2006.01)

(52) U.S. Cl.
CPC .......... *G11C 11/1675* (2013.01); *H01L 27/222* (2013.01); *H01L 43/08* (2013.01)

(58) Field of Classification Search
CPC .................................. G11C 11/15; G11C 11/16
USPC ........................................................... 365/158
See application file for complete search history.

(56) References Cited

U.S. PATENT DOCUMENTS

| | | | | |
|---|---|---|---|---|
| 5,541,868 | A * | 7/1996 | Prinz | 365/98 |
| 6,111,784 | A * | 8/2000 | Nishimura | 365/173 |
| 6,768,152 | B2 * | 7/2004 | Higo | 257/295 |
| 6,906,947 | B2 * | 6/2005 | Bloomquist et al. | 365/158 |
| 7,116,575 | B1 * | 10/2006 | Katti | 365/158 |
| 7,120,048 | B2 * | 10/2006 | Sundstrom | 365/158 |

* cited by examiner

*Primary Examiner* — Son Mai
(74) *Attorney, Agent, or Firm* — CKC & Partners Co., Ltd.

(57) ABSTRACT

A ring-shaped magnetoresistive memory device includes a ring-shaped magnetoresistive memory cell, a first conductor, and a second conductor. The first conductor is positioned on a first surface of the ring-shaped magnetoresistive memory cell for generating a first magnetic field pulse. The second conductor is positioned on a second surface of the ring-shaped magnetoresistive memory cell for generating a second magnetic field pulse. The first surface is opposite to the second surface. An extension direction of the first conductor is perpendicular to an extension direction of the second conductor. A time delay is between the first magnetic field pulse and the second magnetic field pulse.

10 Claims, 7 Drawing Sheets

RING-SHAPED MAGNETORESISTIVE MEMORY DEVICE AND WRITING METHOD THEREOF

RELATED APPLICATIONS

This application claims priority to Taiwan Application Serial Number 102125598, filed Jul. 17, 2013, which is herein incorporated by reference.

BACKGROUND

1. Technical Field

The present disclosure relates to a magnetoresistive memory device and a writing method thereof. More particularly, the present disclosure relates to a ring-shaped magnetoresistive memory device and a writing method thereof.

2. Description of Related Art

A magnetoresistive random access memory (MRAM) is non-volatile memory. The MRAM is capable reading and writing at a high speed as that of static random access memory (SRAM), and has a high record density as a dynamic RAM (DRAM). In this regard, the MRAM has become one of the most important developments for future memories.

The MRAM can have a plurality of memory cells. One of the simplest structures of memory cells may have three layers, which in order are a magnetic layer, a separation layer and another magnetic layer. One of the two magnetic layers is employed as a data layer for storing data, which is also called a free layer. The other magnetic layer is employed as a fixed layer, which is also called a pinned layer, and a magnetization direction thereof is fixed (pinned). The separation layer disposed between the two magnetic layers can be made of non-magnetic metallic material or non-conductive (electrically insulating) material. The non-magnetic metallic material may be made of a giant magnetoresistance (GMR)-based component; the non-conductive material may be made of a tunneling magnetoresistance (TMR)-based component. When a magnetization direction of the data layer is identical to the magnetization direction of the fixed layer, the memory cell of the MRAM is in a low resistance state. When the magnetization direction of the data layer is contrary to the magnetization direction of the fixed layer, the memory cell of the MRAM is in a high resistance state. Therefore, digital signals of "0" or "1" are recorded in response to the two resistance states of the memory cell of the MRAM.

Furthermore, the memory cell has a dimension about several tens to hundreds of nanometers of an anisotropic oval shape, so as to keep the data stability thereof. However, a record density of the oval-shaped memory cell is limited due to the magnetostatic interaction between the adjacent oval-shaped memory cells. To address the problem, a ring-shaped memory cell is provided. When a plurality of magnetic moments of the ring-shaped memory cell is circularly arranged (in a circulation state), there are no magnetic charges generated at the boundary of the ring-shaped memory cell, and the magnetostatic interaction between the adjacent oval-shaped memory cells can be avoided. As such, the limitation of the record density of the ring-shaped memory cell can be avoided accordingly. Therefore, the ring-shaped memory cell becomes the first choice for enhancing the record density.

Although the record density of the ring-shaped memory cell can be enhanced, how to write data for the ring-shaped memory cell is still a difficult problem. In case of the circularly arranged magnetic moments of the ring-shaped memory cell, the orientations of the magnetic moments thereof along a counterclockwise direction or along a clockwise direction are used to represent "0" or "1" respectively. Therefore, it is critical to control the orientations of the magnetic moments with a low energy-consuming method for practical application.

At present, the writing methods of the MRAM can be sorted into three categories: magnetic writing method, current writing method, and a thermally assisted writing method (TA-MRAM). The magnetic writing method is base on a traditional X-Y selection by selecting an address line to generate a magnetic field for changing a magnetization direction of a memory cell. The required magnetic field is increased with the reduced dimension of the memory cell, which consumes more energy and may possible burn out the memory cell. The current writing method changing the magnetization direction of a memory cell by spin transfer torque generated from a spin-polarized current. However, the spin-polarized current required for the current writing method is still high, and it is required a highly advanced technique to make a magnetic tunnel junction of the kind of memory cell. Therefore, the current writing method has drawbacks of high manufacturing difficulty and high cost. Further, the thermally assisted writing method heats a magnetic tunnel junction by using a direct current so as to reduce the coercivity of the free layer. Comparing with the former two writing methods, the thermally assisted writing method may generate a magnetic field with less writing current.

A writing method for the MRAM is disclosed in U.S. Pat. No. 6,545,906 B1, in which a magnetization direction of a free layer of an oval-shaped memory cell is changed by a "toggle write mode". In this disclosure, the free layer of the MRAM uses a synthetic antiferromagnet (SAF) structure, i.e., a thin metal layer of Ru that is disposed between two magnetic layers, and an angle between a long axis of the oval-shaped memory cell and an address line for writing is 45 degrees. Accordingly, a specific manufacturing process is required for satisfying the above limitations of structure of the memory cell and the writing method, which limits the scope of the applications for the technique.

Moreover, a writing method of a ring-shaped memory cell is provided by Jian-Gang Zhu, Youfeng Zheng and Gary A. Prinz in Carnegie Mellon University (J. Appl. Phys. 87, 6668 (2000)). The orientations of the magnetic moments are controlled by an in-plane field. First, a hole of the ring-shaped memory cell is deviate from a central position. Then a small cut is formed at the ring portion of the ring-shaped memory cell. Also, the manufacture of the ring-shaped memory cell highly depends on delicate and complicated process steps, and some of them may even need the application of an e-beam lithography. As a result, the writing method has drawbacks of difficulty manufacturing process, high cost and an unsatisfied yield ratio.

Given the above, the manufacturing techniques and writing methods of the conventional memory device both met the problems of complicated and difficult manufacturing process, so that the manufacturing yield is hard to be enhanced, and the cost is kept high.

SUMMARY

According to one aspect of the present disclosure, a ring-shaped magnetoresistive memory device includes a ring-shaped magnetoresistive memory cell, a first conductor, and a second conductor. The first conductor is positioned on a first surface of the ring-shaped magnetoresistive memory cell for generating a first magnetic field pulse. The second conductor is positioned on a second surface of the ring-shaped magnetoresistive memory cell for generating a second magnetic field pulse. The first surface is opposite to the second surface. An extension direction of the first conductor is perpendicular to an extension direction of the second conductor. A time delay is between the first magnetic field pulse and the second magnetic field pulse.

According to another aspect of the present disclosure, a writing method of a ring-shaped magnetoresistive memory device includes steps as follows. A ring-shaped magnetoresistive memory cell, a first conductor and a second conductor are provided, wherein the first conductor is positioned on a first surface of the ring-shaped magnetoresistive memory cell, the second conductor is positioned on a second surface of the ring-shaped magnetoresistive memory cell, the first surface is opposite to the second surface, and an extension direction of the first conductor is perpendicular to an extension direction of the second conductor. A first magnetic field pulse is generated via the first conductor. A second magnetic field pulse is generated via the second conductor. A time delay is between the first magnetic field pulse and the second magnetic field pulse so as to orientate a plurality of magnetic moments of the ring-shaped magnetoresistive memory cell.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
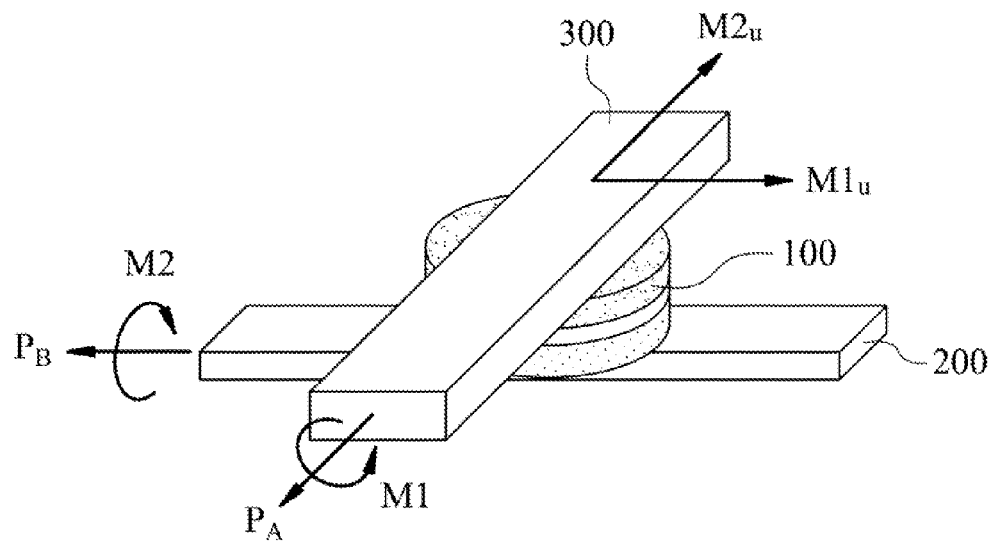
FIG. 1 is a schematic view of a ring-shaped magnetoresistive memory device according to one embodiment of one aspect of the present disclosure.

FIG. 1 is a schematic view of a ring-shaped magnetoresistive memory device according to one embodiment of one aspect of the present disclosure. The ring-shaped magnetoresistive memory device includes a ring-shaped magnetoresistive memory cell 100, a first conductor 300, and a second conductor 200. The first conductor 300 is positioned on a first surface of the ring-shaped magnetoresistive memory cell 100 for generating a first magnetic field pulse M1. The first magnetic field pulse M1 is generated from a first current pulse, and a direction of the first current pulse is represented by $P_A$. The second conductor 200 is positioned on a second surface of the ring-shaped magnetoresistive memory cell 100 for generating a second magnetic field pulse M2. The first surface of the ring-shaped magnetoresistive memory cell 100 is opposite to the second surface of the ring-shaped magnetoresistive memory cell 100. An extension direction of the first conductor 300 is perpendicular to an extension direction of the second conductor 200. A time delay is between the first magnetic field pulse M1 and the second magnetic field pulse M2. The second magnetic field pulse M2 is generated from a second current pulse, and a direction of the second current pulse is represented by $P_B$. In the embodiment, the ring-shaped magnetoresistive memory cell 100 is located below the first conductor 300, and a first magnetic field vector $M1_u$ is provided by the first magnetic field pulse M1 to the ring-shaped magnetoresistive memory cell 100. The ring-shaped magnetoresistive memory cell 100 is located above the second conductor 200, and a second magnetic field vector $M2_u$ is provided by the second magnetic field pulse M2 to the ring-shaped magnetoresistive memory cell 100.

Figure 2:
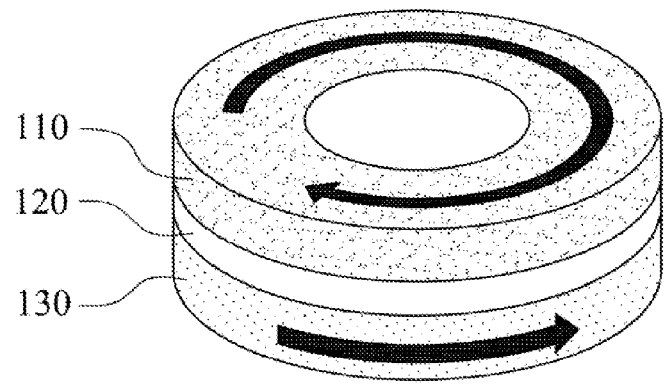
FIG. 2 is a schematic view of a ring-shaped magnetoresistive memory cell in FIG. 1.

FIG. 2 is a schematic view of the ring-shaped magnetoresistive memory cell 100 in FIG. 1. The ring-shaped magnetoresistive memory cell 100 is formed in a ring, and can include a first magnetic layer 110, a separation layer 120 and a second magnetic layer 130. One of the first magnetic layer 110 and the second magnetic layer 130 can be employed as a data layer, and the other can be employed as a pinned layer, wherein a magnetization direction of the data layer can be changed for storing data, and a magnetization direction of the pinned layer is pinned. The separation layer 120 can be made of non-magnetic metallic material, so that the ring-shaped magnetoresistive memory cell 100 is a GMR-based memory cell. The GMR-based memory cell refers to a memory cell which is based on the giant magnetoresistance effect. The separation layer 120 can be made of non-conductive material, so that the ring-shaped magnetoresistive memory cell 100 is a TMR-based memory cell. The TMR-based memory cell refers to a memory cell which is based on the tunneling magnetoresistance effect. In the embodiment, the second magnetic layer 130 is employed as the pinned layer, and the first magnetic layer 110 is employed as a data layer.

As shown in FIG. 2, the second magnetic layer 130 is employed as the pinned layer and a magnetization direction thereof is pinned. Magnetic moments of the second magnetic layer 130 are arranged to orientate along a counterclockwise direction. When magnetic moments of the first magnetic layer 110 orientate along a clockwise direction, which is contrary to the second magnetic layer 130, the ring-shaped magnetoresistive memory cell 100 is in a high resistance state. When the magnetic moments of the first magnetic layer 110 orientate along a counterclockwise direction, which is identical to the second magnetic layer 130, the ring-shaped magnetoresistive memory cell 100 is in a low resistance. Therefore, the resistance state of the ring-shaped magnetoresistive memory cell 100 can be changed in response to the orientations of the magnetic moments of the first magnetic layer 110 so as to be recorded as "0" or "1". In other embodiment, the magnetic moments of the pinned layer can be arranged to orientate along a clockwise direction according to practical demand. The high resistance state of the ring-shaped magnetoresistive memory cell 100 can be obtained by orientating the magnetic moments of the data layer along a counterclockwise direction, and a low resistance state of the ring-shaped magnetoresistive memory cell 100 can be obtained by orientating the magnetic moments of the data layer along a clockwise direction, and the data can be recorded accordingly.

The magnetic moments of the first magnetic layer 110 (employer as the data layer) can be orientated via the first conductor 300 and the second conductor 200, which is explained as follows.

Figure 3:
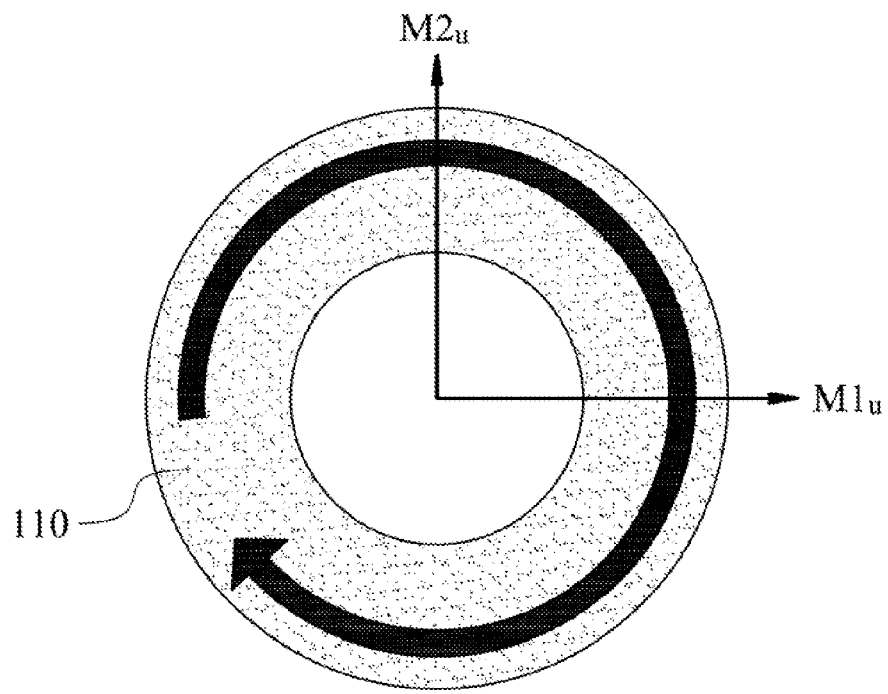
FIG. 3 is a top view of the ring-shaped magnetoresistive memory cell in FIG. 1.
Figure 4:
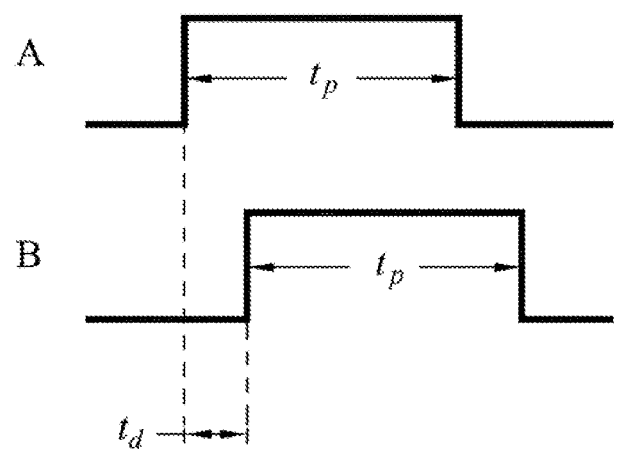
FIG. 4 shows a waveform of a first current pulse whose direction is represented by $P_A$ in FIG. 1 and a waveform of a second current pulse whose direction is represented by $P_B$ in FIG. 1.

FIG. 3 is a top view of the ring-shaped magnetoresistive memory cell 100 in FIG. 1, wherein the magnetic moments of the first magnetic layer 110 are orientated along a clockwise direction. FIG. 4 shows a waveform of the first current pulse A whose direction is represented by $P_A$ in FIG. 1, and a waveform of the second current pulse B whose direction is represented by $P_B$ in FIG. 1. When the first current pulse A is generated earlier than the second current pulse B, the first magnetic field pulse M1 generated from the first current pulse A first acts on the ring-shaped magnetoresistive memory cell 100 with the first magnetic field vector $M1_u$ and then the second magnetic field pulse M2 generated from the second current pulse B acts on the ring-shaped magnetoresistive memory cell 100 with the second magnetic field vector $M2_u$. That means a direction from the first magnetic field vector $M1_u$ to the second magnetic field vector $M2_u$ is counterclockwise. In other words, the first magnetic field pulse M1 and the second magnetic field pulse M2 act on the ring-shaped magnetoresistive memory cell 100 in an order of counterclockwise. As a result, the magnetic moments of the first magnetic layer 110 of the ring-shaped magnetoresistive memory cell 100 can be orientated along a counterclockwise direction. Similarly, when the first magnetic field pulse M1 and the second magnetic field pulse M2 act on the ring-shaped magnetoresistive memory cell 100 in an order of clockwise, the magnetic moments of the first magnetic layer 110 of the ring-shaped magnetoresistive memory cell 100 can be orientated along a clockwise direction.

In FIG. 4, a lasting time of the first current pulse A is $t_p$, and a magnitude of the magnetic field generated from the first current pulse A is H (not shown). A lasting time of the second current pulse B can also be $t_p$, and a magnitude of the magnetic field generated from the second current pulse B can also be H (not shown). A time delay $t_d$ is between the first current pulse A and the second current pulse B. A proper combination of ($t_d$, $t_p$, H) can be calculated by a micromagnetic simulation so as to orientate the magnetic moments of the first magnetic layer 110. The first current pulse A and the second current pulse B can be adjusted according to practical demand, so long as the magnetic moments of the first magnetic layer 110 can be orientated along a counterclockwise direction or a clockwise direction. For an example, the lasting time and the magnitude of the first current pulse A can be different from the lasting time and the magnitude of the second current pulse B.

The micromagnetic simulation can be carried out by a simulation software, such as OOMMF (Object Oriented MicroMagnetic Framework, which is introduced in the following website: http://math.nist.gov/oommf/) developed by the National Institute of Standards and Technology (NIST), or MAGPAR (which is introduced in the following website: http://www.magpar.net/). According to one example of the present disclosure, an inner diameter of the ring-shaped magnetoresistive memory cell 100 is 105 nm, an outer diameter of the ring-shaped magnetoresistive memory cell 100 is 190 nm, and a thickness of the ring-shaped magnetoresistive memory cell 100 is 2 nm. After calculating and cross validating by OOMMF and MAGPAR, the following values are obtained: the time delay $t_d$ between the first current pulse A and the second current pulse B is 75 ps (picosecond, 1 ps=$10^{-12}$ s), the lasting time is 225 ps, the magnitude H of the magnetic field generated from the first current pulse A or the second current pulse B is 55 mT to 61 mT. The aforementioned values enable the magnetic moments of the first magnetic layer 110 to be orientated along a counterclockwise direction or a clockwise direction.

Figure 5A:
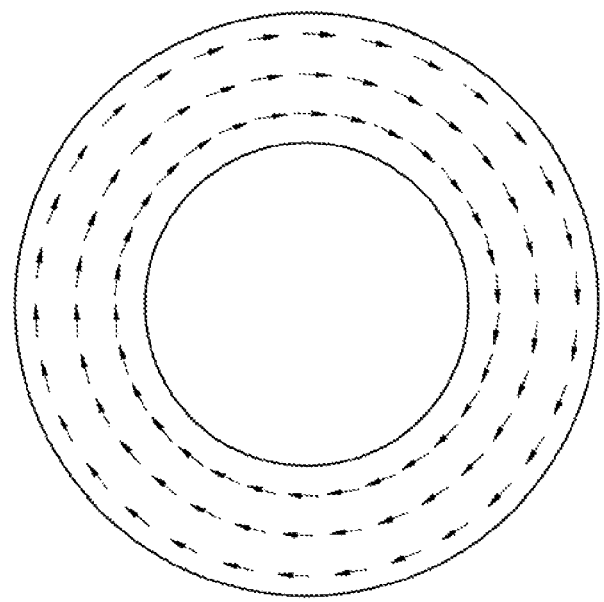
FIG. 5A~FIG. 5E show the snapshots of magnetic moments of the ring-shaped magnetoresistive memory cell in FIG. 1 during reversal from clockwise to counterclockwise state.
Figure 5B:
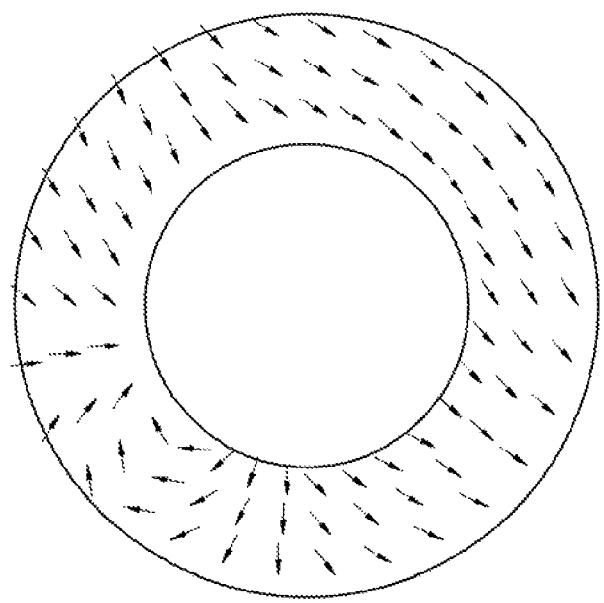
Figure 5C:
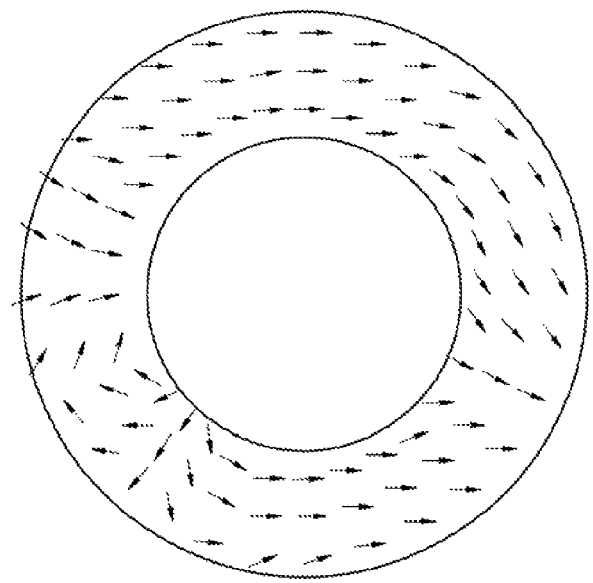
Figure 5D:
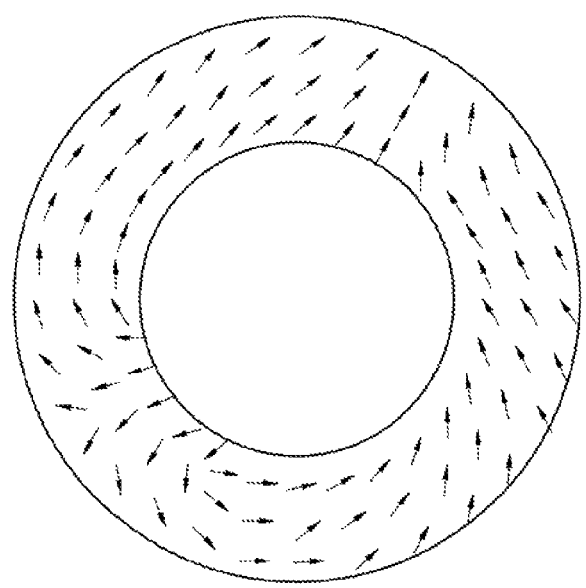
Figure 5E:
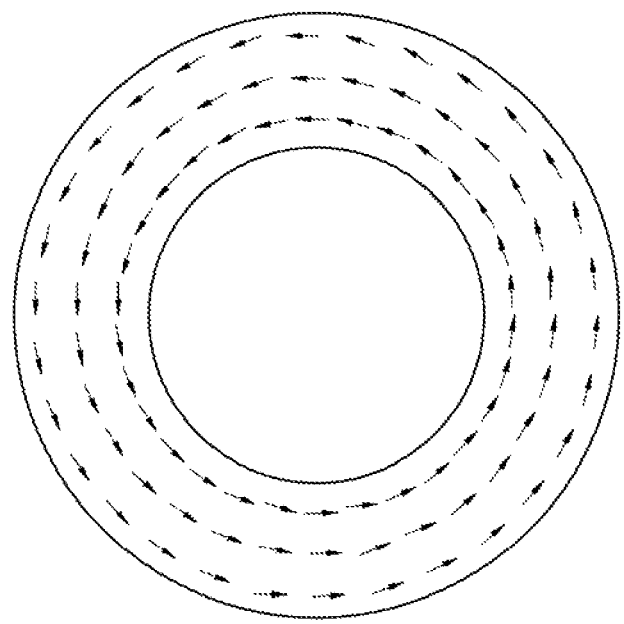

Please refer to FIG. 1 to FIG. 4 and FIG. 5A to FIG. 5E at the same time. FIG. 5A~FIG. 5E show the snapshots of magnetic moments of the first magnetic layer 110 of the ring-shaped magnetoresistive memory cell 100 in FIG. 1 during reversal from clockwise to counterclockwise state, wherein the time delay $t_d$ is 75 ps, the lasting time $t_p$ is 225 ps, the magnitude H generated from the first current pulse A is 55 mT to 61 mT, the magnitude H generated from the second current pulse B is 55 mT to 61 mT. At the beginning, the magnetic moments of the first magnetic layer 110 orientate along a clockwise direction as shown in FIG. 5A. Then the magnetic moments of the first magnetic layer 110 are orientated along a counterclockwise direction as shown in FIG. 5E.

In FIG. 5A the time point is 0 ps. At this time point, the first magnetic field pulse M1 and the second magnetic field pulse M2 have not been generated, and the magnetic moments of the first magnetic layer 110 orientate along a clockwise direction.

In FIG. 5B, the time paint is 75 ps. At this time point, the first magnetic field pulse M1 has been generated for 75 ps, and the second magnetic field pulse M2 is about to be generated.

In FIG. 5C, the time point is 225 ps. At this time point, the first magnetic field pulse M1 is just over, and the second magnetic field pulse M2 is still acting.

In FIG. 5D, the time point is 300 ps. At this time point, the second magnetic field pulse M2 is over, too.

After the time point of 300 ps, the first conductor 300 and the second conductor 200 are no longer to provide the magnetic fields. Therefore, the first magnetic layer 110 of the ring-shaped magnetoresistive memory cell 100 begins the process of relaxation. After 5 ns of relaxation, the magnetic moments of the first magnetic layer 110 have been orientated along a counterclockwise direction.

Figure 6:
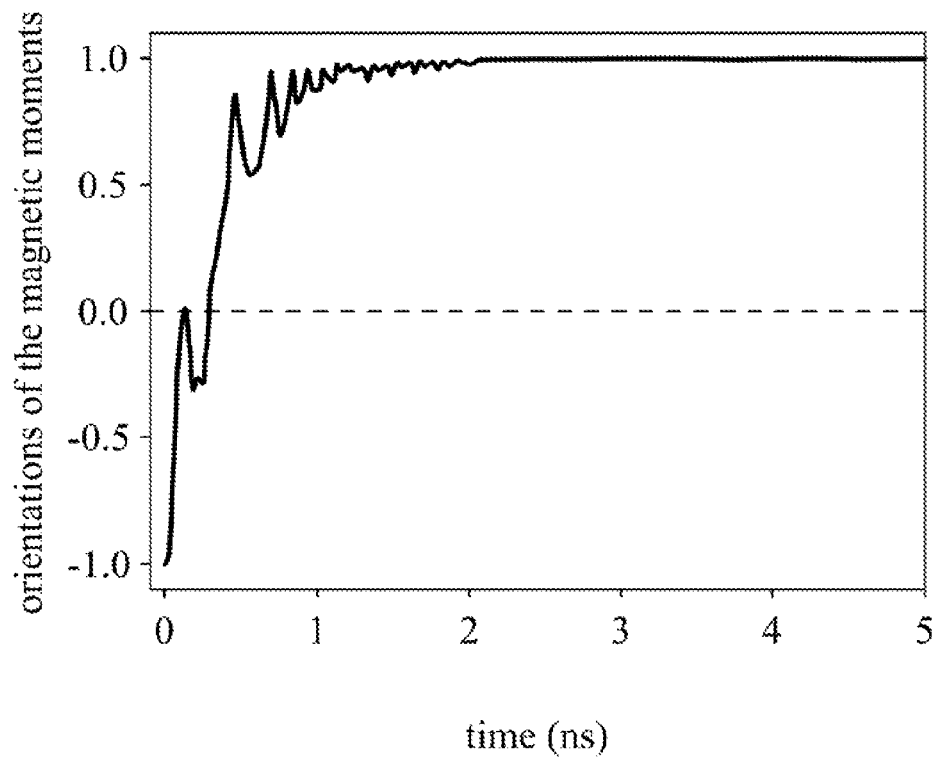
FIG. 6 shows a relationship between the orientations of the magnetic moments of the ring-shaped magnetoresistive memory cell and time.

FIG. 6 shows a relationship between the orientations of the magnetic moments of the ring-shaped magnetoresistive memory cell 100 and time. Specifically, FIG. 6 shows a relationship between the orientations of the magnetic moments of the first magnetic layer 110 of the ring-shaped magnetoresistive memory cell 100 and time, wherein the orientations of the magnetic moments of the first magnetic layer 110 at each of the time points can be calculated by the following formula:

$$\oint ((\nabla \times \overline{M})_Z \cdot dS$$

Then a normalized value at each of the time points is obtained by normalizing the foregoing calculated results. The normalized values of the time points are plotted respect to the time points so as to obtain FIG. 6. In FIG. 6, when at the time point of 300 ps, i.e., at the beginning of the process of relaxation, the normalized value which represents the orientations of the magnetic moments of the first magnetic layer 110 is from negative (representing the clockwise direction) to positive (representing the counterclockwise direction).

Figure 7:
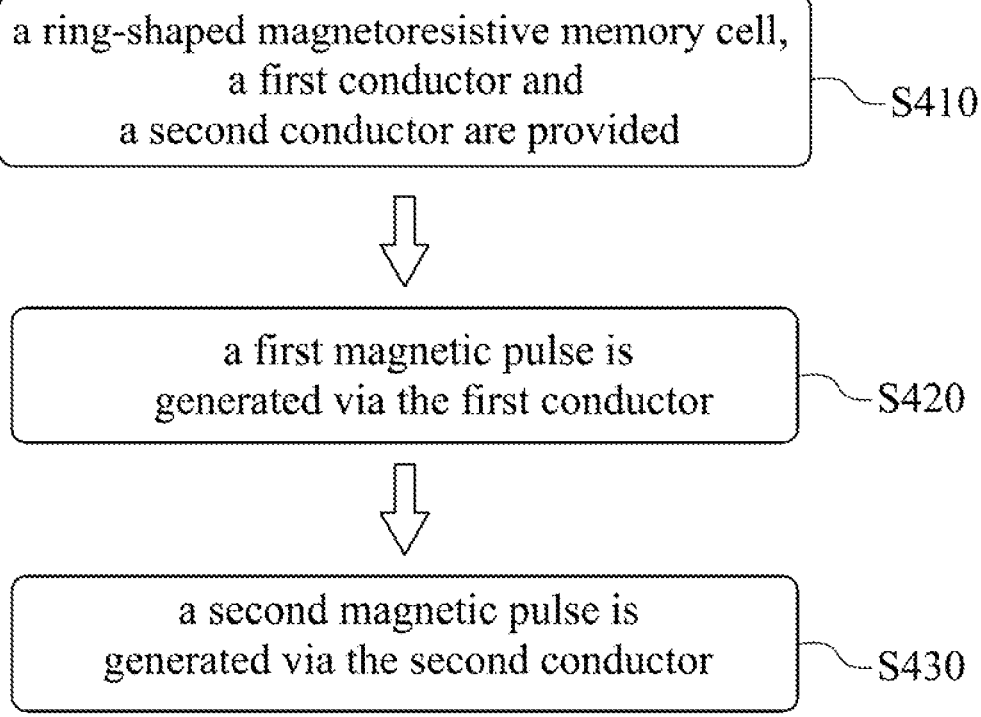
FIG. 7 is a flow diagram of a writing method of a ring-shaped magnetoresistive memory device according to one embodiment of another aspect of the present disclosure.

FIG. 7 is a flow diagram of a writing method of a ring-shaped magnetoresistive memory device according to one embodiment of another aspect of the present disclosure. The writing method of the ring-shaped magnetoresistive memory device includes steps as follows. In Step S410, a ring-shaped magnetoresistive memory cell, a first conductor and a second conductor are provided, wherein the first conductor is positioned on a first surface of the ring-shaped magnetoresistive memory cell, the second conductor is positioned on a second surface of the ring-shaped magnetoresistive memory cell, the first surface is opposite to the second surface, and an extension direction of the first conductor is perpendicular to an extension direction of the second conductor. In Step S420, a first magnetic field pulse is generated via the first conductor. In Step S430, a second magnetic field pulse is generated via the second conductor, wherein a time delay is between the first magnetic field pulse and the second magnetic field pulse so as to orientate a plurality of magnetic moments of the ring-shaped magnetoresistive memory cell.

According to the writing method of the ring-shaped magnetoresistive memory device, a magnetic field of the first magnetic field pulse and a magnetic field of the second magnetic field pulse can have an equal magnitude, and the magnetic field of the first magnetic field pulse and the magnetic field of the second magnetic field pulse can have an equal lasting time. The delay time between the first magnetic field pulse and the second magnetic field pulse, the magnitude and the lasting time of the magnetic field of the first magnetic field pulse, and the magnitude and the lasting time of the magnetic field of the second magnetic field pulse can be calculated by a micromagnetic simulation. According to the writing method of the ring-shaped magnetoresistive memory device, a first magnetic field vector is provided by the first magnetic field pulse to the ring-shaped magnetoresistive memory cell, and a second magnetic field vector is provided by the second magnetic field pulse to the ring-shaped magnetoresistive memory cell. When the first magnetic field pulse is generated earlier than the second magnetic field pulse, and a direction from the first magnetic field vector to the second magnetic field vector is counterclockwise, the magnetic moments of the ring-shaped magnetoresistive memory cell are orientated along a counterclockwise direction. When the first magnetic field pulse is generated earlier than the second magnetic field pulse, and a direction from the first magnetic field vector to the second magnetic field vector is clockwise, the magnetic moments of the ring-shaped magnetoresistive memory cell are orientated along a clockwise direction.

In conclusion, the ring-shaped magnetoresistive memory device and the writing method thereof have advantages as follows.

First, a change of the manufacturing process is not necessary. Specifically, the magnetic moments of the ring-shaped magnetoresistive memory cell are orientated by the writing method, so that the change of the manufacturing process is not necessary.

Second, the cost of the ring-shaped magnetoresistive memory device is low, and the manufacturing yield is high, which are resulted from the uncomplicated manufacturing process.

Third, the record density of the ring-shaped magnetoresistive memory device is high. Without the magnetostatic interaction which occurs in a conventional oval-shaped magnetoresistive memory device, the record density of the ring-shaped magnetoresistive memory device is enhanced thereby.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the cope of the following claims.

What is claimed is:

1. A ring-shaped magnetoresistive memory device, comprising:
    a ring-shaped magnetoresistive memory cell;
    a first conductor positioned on a first surface of the ring-shaped magnetoresistive memory cell for generating a first magnetic field pulse; and
    a second conductor positioned on a second surface of the ring-shaped magnetoresistive memory cell for generating a second magnetic field pulse;
    wherein the first surface is opposite to the second surface, an extension direction of the first conductor is perpendicular to an extension direction of the second conductor, and a time delay is between the first magnetic field pulse and the second magnetic field pulse.

2. The ring-shaped magnetoresistive memory device of claim 1, wherein the ring-shaped magnetoresistive memory cell is a GMR-based memory cell.

3. The ring-shaped magnetoresistive memory device of claim 1, wherein the ring-shaped magnetoresistive memory cell is a TMR-based memory cell.

4. The ring-shaped magnetoresistive memory device of claim 1, wherein an arrangement of a plurality of magnetic moments of the ring-shaped magnetoresistive memory cell is circular.

5. The ring-shaped magnetoresistive memory device of claim 1, wherein a magnetic field of the first magnetic field pulse and a magnetic field of the second magnetic field pulse have an equal magnitude and lasting time.

6. A writing method for a ring-shaped magnetoresistive memory device, comprising:
    providing a ring-shaped magnetoresistive memory cell, a first conductor and a second conductor, wherein the first conductor is positioned on a first surface of the ring-shaped magnetoresistive memory cell, the second conductor is positioned on a second surface of the ring-shaped magnetoresistive memory cell, the first surface is opposite to the second surface, and an extension direction of the first conductor is perpendicular to an extension direction of the second conductor;
    generating a first magnetic field pulse via the first conductor; and
    generating a second magnetic field pulse via the second conductor, wherein a time delay is between the first magnetic field pulse and the second magnetic field pulse so as to orientate of a plurality of magnetic moments of the ring-shaped magnetoresistive memory cell.

7. The writing method of the ring-shaped magnetoresistive memory device of claim 6, a magnetic field of the first magnetic field pulse and a magnetic field of the second magnetic field pulse have an equal magnitude and lasting time.

8. The writing method of the ring-shaped magnetoresistive memory device of claim 6, further comprising:
    calculating the delay time between the first magnetic field pulse and the second magnetic field pulse, a magnitude and a lasting time of a magnetic field of the first magnetic field pulse, and a magnitude and a lasting time of a magnetic field of the second magnetic field pulse by a micromagnetic simulation.

9. The writing method of the ring-shaped magnetoresistive memory device of claim 6, wherein a first magnetic field vector is provided by the first magnetic field pulse to the ring-shaped magnetoresistive memory cell, a second magnetic field vector is provided by the second magnetic field pulse to the ring-shaped magnetoresistive memory cell; when the first magnetic field pulse is generated earlier than the second magnetic field pulse, and a direction from the first magnetic field vector to the second magnetic field vector is counterclockwise, the magnetic moments of the ring-shaped magnetoresistive memory cell are orientated along a counterclockwise direction.

10. The writing, method of the ring-shaped magnetoresistive memory device of claim 6, wherein a first magnetic field vector is provided by the first magnetic field pulse to the ring-shaped magnetoresistive memory cell, a second magnetic field vector is provided by the second magnetic field pulse to the ring-shaped magnetoresistive memory cell; when the first magnetic field pulse is generated earlier than the second magnetic field pulse, and a direction from the first magnetic field vector to the second magnetic field vector is clockwise, the magnetic moments of the ring-shaped magnetoresistive memory cell are orientated along a clockwise direction.

\* \* \* \* \*